United States Patent [19]
Robinson

[11] Patent Number: 5,937,497
[45] Date of Patent: Aug. 17, 1999

[54] METHOD FOR REMOVING PARTS FROM TAPE

[75] Inventor: Keith Robinson, Caldwell, Id.

[73] Assignee: Micron Electronics, Inc., Nampa, Id.

[21] Appl. No.: 08/999,307

[22] Filed: Dec. 29, 1997

[51] Int. Cl.$^6$ ...................................................... B23P 19/00
[52] U.S. Cl. ............................ 29/426.3; 29/762; 221/72; 221/82; 156/584; 156/344
[58] Field of Search .............................. 221/72, 82; 29/762, 29/426.3, 426.4, 809, 740; 156/344, 584; 414/404, 411, 418; 226/109, 152, 181

[56] References Cited

U.S. PATENT DOCUMENTS

| | | | |
|---|---|---|---|
| 4,660,282 | 4/1987 | Pfaff | 29/829 |
| 5,148,969 | 9/1992 | Boucher et al. | 156/584 |
| 5,268,059 | 12/1993 | Olson | 156/584 |
| 5,454,900 | 10/1995 | Han et al. | 156/584 |
| 5,496,432 | 3/1996 | Sumi et al. . | |
| 5,715,592 | 2/1998 | Mori et al. | 29/426.3 |

*Primary Examiner*—David P. Bryant
*Attorney, Agent, or Firm*—Dorsey & Whitney LLP

[57] ABSTRACT

A method for removing parts from socketed tape sealed with sealing tape. The method comprises placing the socketed tape sealed with sealing tape in a channel with the socket openings facing the lower surface of the channel, stripping the sealing tape from the socketed tape through an orifice in the lower surface of the channel, and collecting the parts as the parts fall free from the socketed tape.

17 Claims, 5 Drawing Sheets

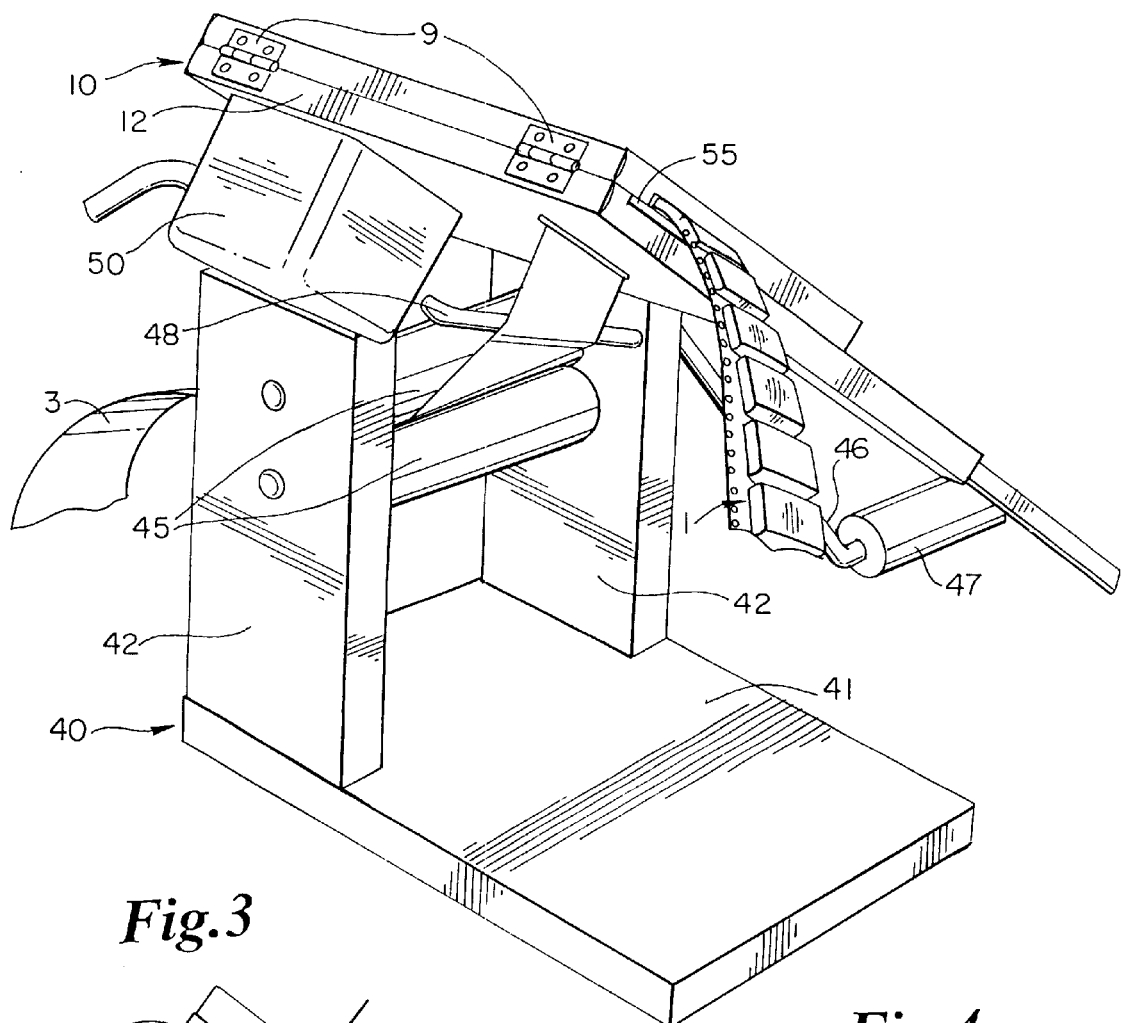
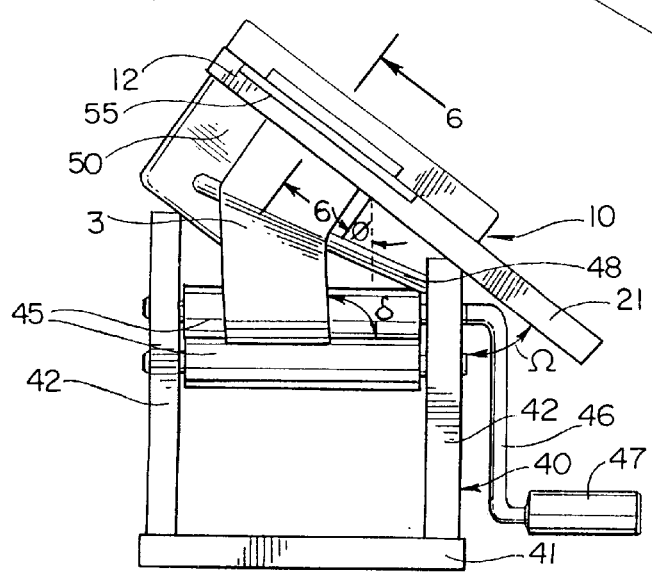
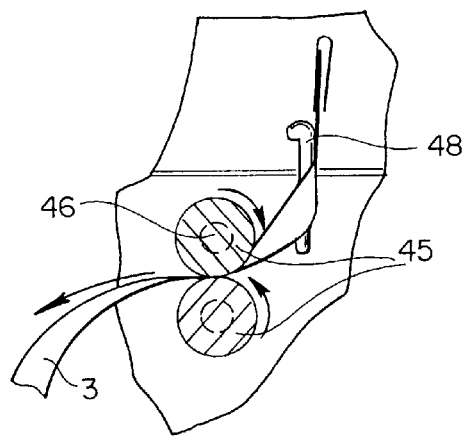

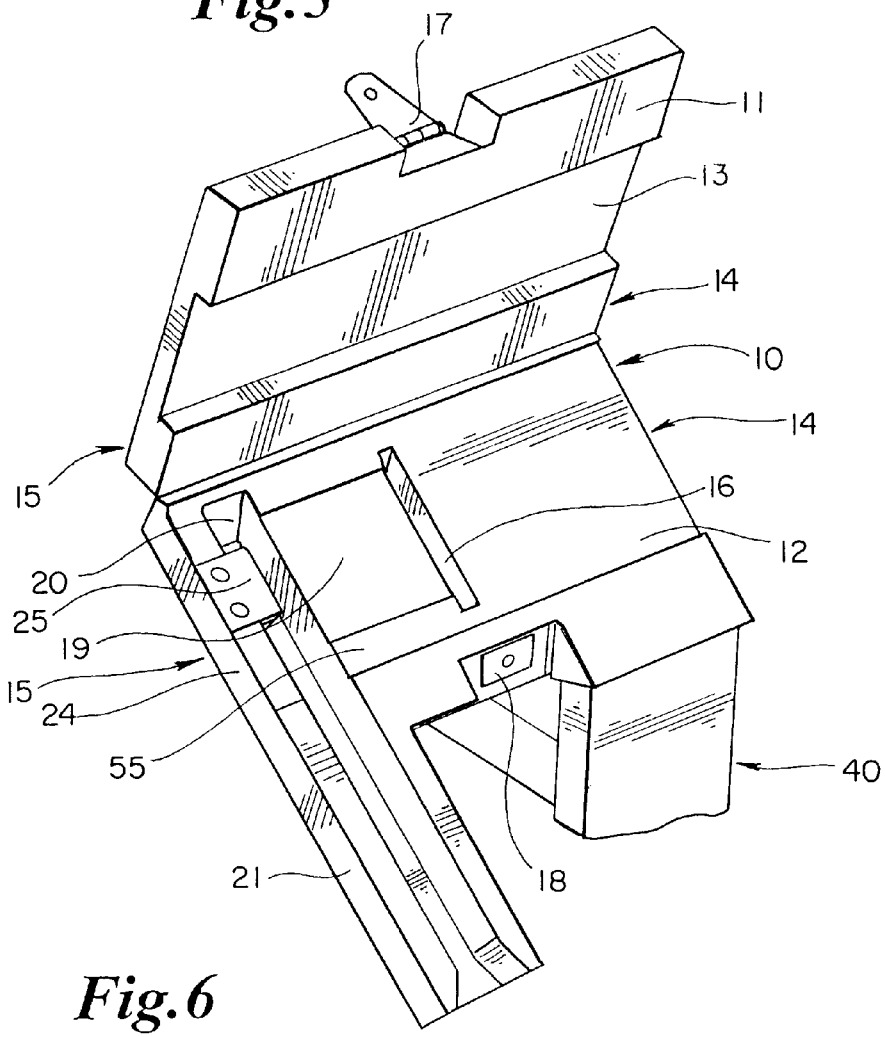
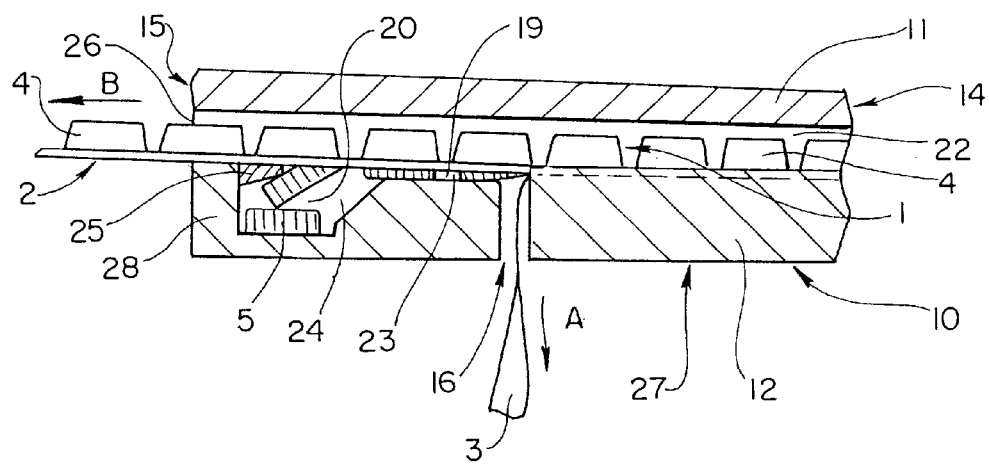

METHOD FOR REMOVING PARTS FROM TAPE

BACKGROUND OF THE INVENTION

1. Field of the Invention

This invention relates to methods for handling parts used in manufacturing. More particularly, this invention relates to methods for removing parts from tape and placing the parts in tubes.

2. Description of the Prior Art

Many circuit board assemblers require parts such as integrated circuit (IC) chips to be packed in reels of plastic tape for use in manufacturing processes. The parts are frequently packed in tape formed with recessed sockets. A second piece of sealing tape is then applied and affixed to the socketed tape to secure the parts within the sockets. Many chips can be packed in adjacent sockets in the same length of tape. The socketed tape sealed with the sealing tape is then wound into a reel of tape, which is a useful form for chip delivery for manufacturing processes. Throughout this specification tape will be used to refer to a length of socketed tape whether or not coiled as a reel of tape.

Parts such as IC chips are often stored in rigid tubes immediately after manufacture. These tubes protect the IC chips and are useful for storage and shipping. Because many manufacturers require parts to be packed in tape for manufacturing processes, reeling machines remove the IC chips from the tubes and place them in socketed tape prior to shipment to manufacturers.

Occasionally, reeling machine malfunctions leave an unacceptable number of empty sockets in the tape. In such cases the properly packed parts must be removed from the tape and placed back into the tubes so that the tubes can be run through the reeling machines again. One current method to remove the parts from the tape is to manually peel the sealing tape from the socketed tape and remove the parts. The parts may then be placed in the tubes by hand. This procedure is very time-consuming, tedious, and expensive due to the nature of the work. Thus, a need exists for a method for de-reeling parts from tape to tubes that is less time-consuming and less expensive than manual de-reeling.

SUMMARY OF THE INVENTION

This invention comprises methods for removing parts from socketed tape sealed with sealing tape. One embodiment of the invention comprises placing the socketed tape sealed with sealing tape in a channel with the socket openings facing the lower surface of the channel, stripping the sealing tape from the socketed tape through an orifice in the lower surface of the channel, and collecting the parts as the parts fall free from the socketed tape. Another embodiment of the invention comprises positioning a tube within a part receiving station in the head assembly to collect the parts as the parts fall free from the socketed tape. Another embodiment of the invention comprises vibrating the socketed tape to cause the parts to fall more freely from the socketed tape.

Yet another embodiment of the invention comprises enclosing the socketed tape in a channel in a head assembly, stripping the sealing tape from the socketed tape through an orifice in the lower side of the head assembly to cause the socketed tape to be conveyed through the channel in the head assembly, and collecting the parts as the parts fall free from the socketed tape.

DESCRIPTION OF THE DRAWINGS

FIG. 2 is a second perspective view of the embodiment shown in FIG. 1;

FIG. 3 is a side view of the embodiment shown in FIG. 1;

FIG. 4 is a rear view of the roller portion of the embodiment shown in FIG. 1;

FIG. 5 is a top view of the head assembly of the embodiment shown in FIG. 1 with the upper head plate in its open position;

FIG. 6 is a cross-sectional view taken along lines 6—6 of FIG. 3;

DETAILED DESCRIPTION

Figure 1:
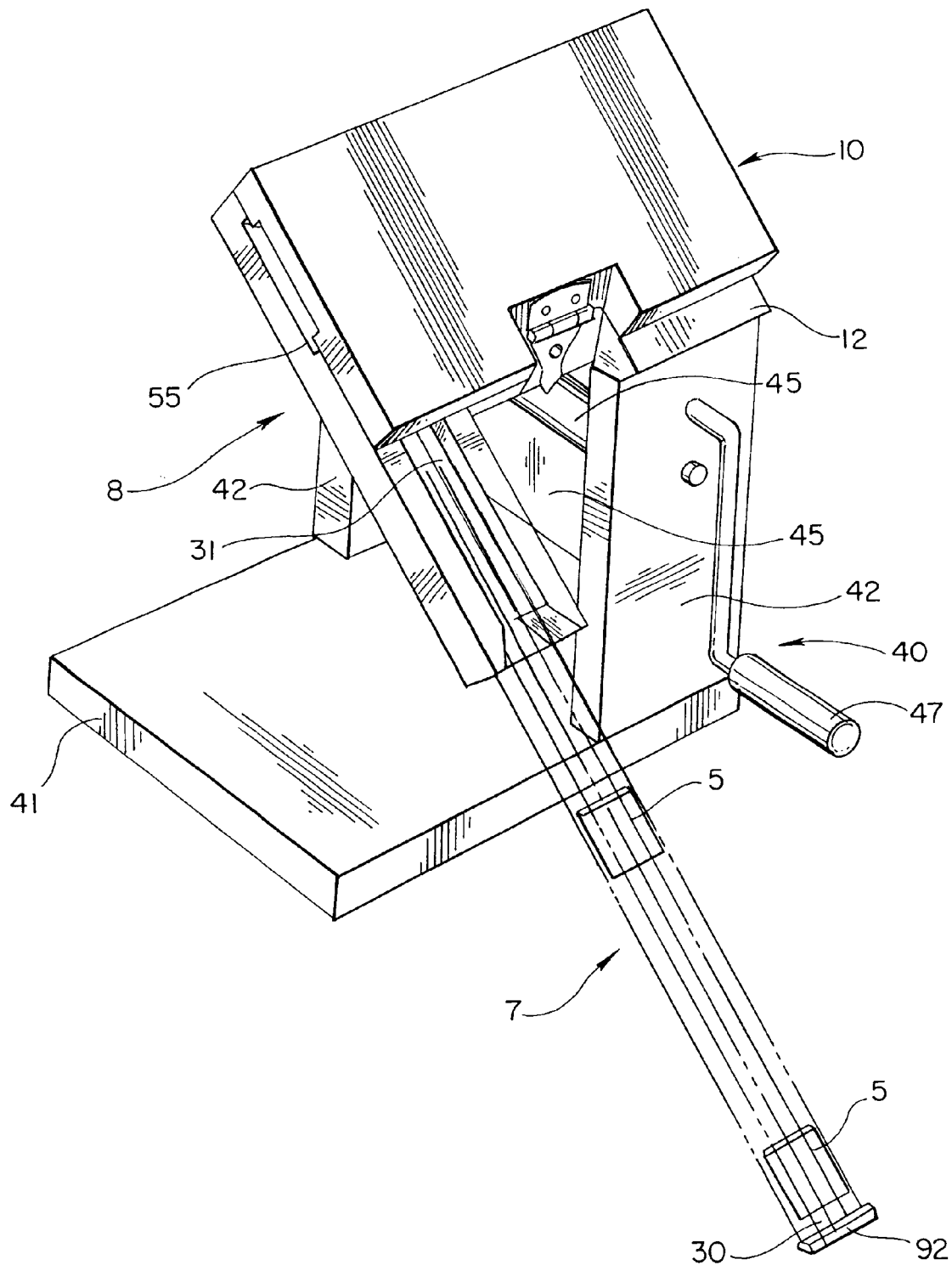
FIG. 1 is a perspective view of an embodiment of the invention.

Referring to FIGS. 2 and 6, there is shown inserted in an embodiment of the invention a segment of a typical tape 1 for storing parts such as IC chips. The tape 1 consists of a socketed tape 2 and a strip of sealing tape 3. The socketed tape 2 contains sockets 4 in which parts 5 fit. Because this socketed tape 2 contains an open side by which the parts 5 are inserted into the sockets 4, the sealing tape 3 is melted (or otherwise affixed) to the socketed tape 2 to seal each socket and secure the parts 5 within the sockets 4 of the socketed tape 3. The socketed tape 2 and the sealing tape 3 are then wound into a reel of tape 1.

Figure 7:
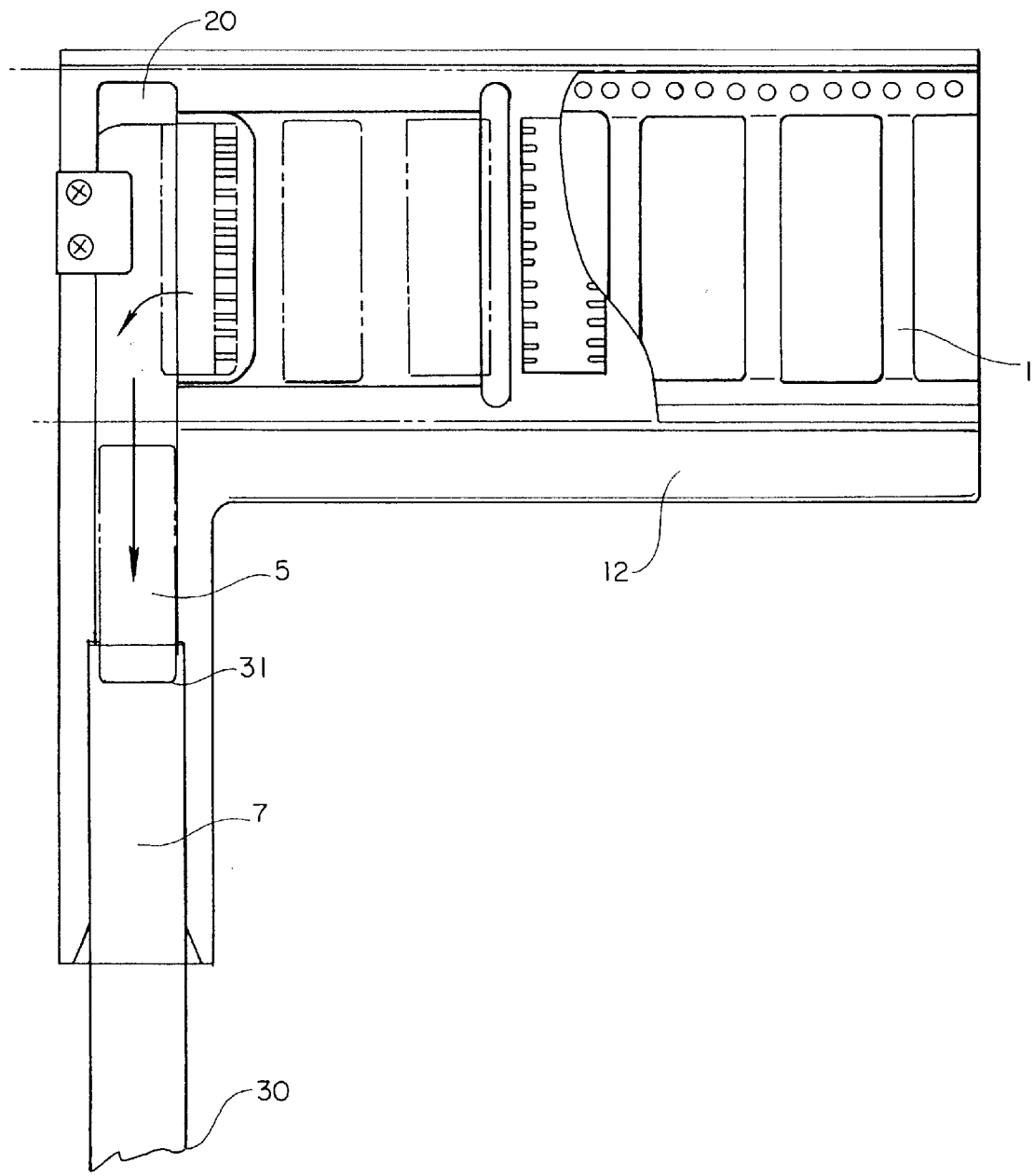
FIG. 7 is a view of the socketed tape passing through the lower head plate of the embodiment shown in FIG. 1.
Figure 8:
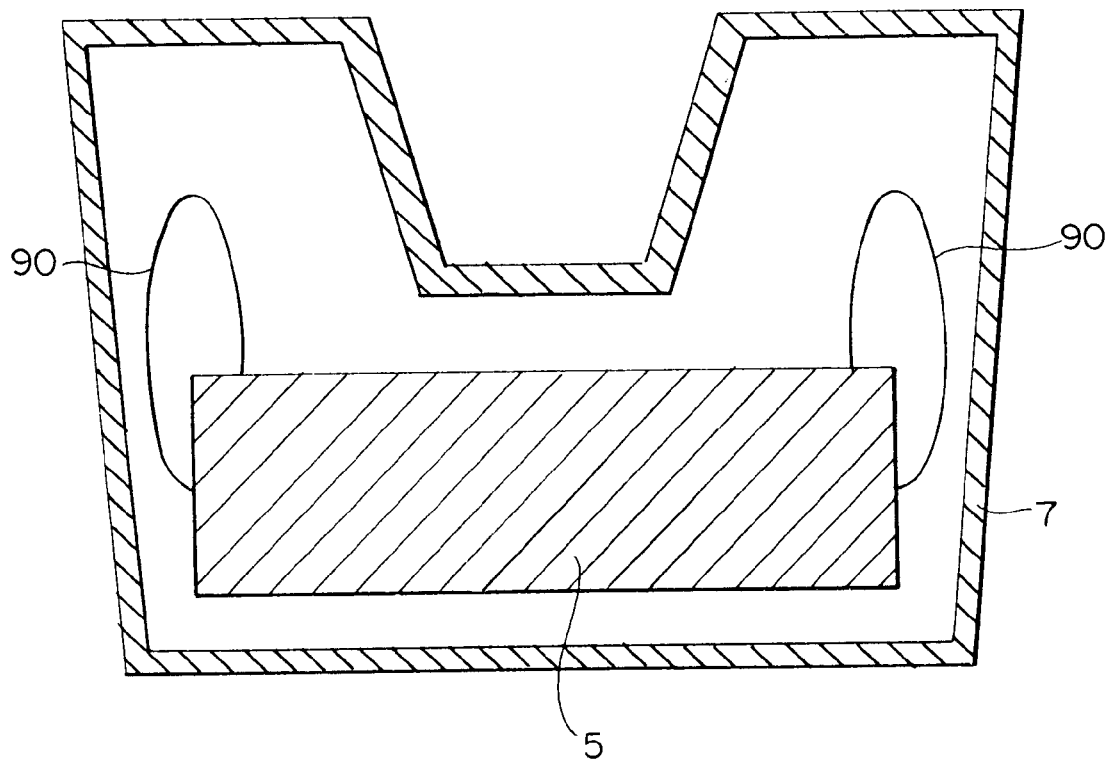
FIG. 8 is a cross-sectional view of a tube with a part in it.

FIGS. 1, 7, and 8 show a typical tube 7 with a generally "U" shaped cross-section that is used to store parts 5. The tube 7 is made of a rigid material such as hard plastic. The parts 5 typically fit within the tube 7 in a predetermined position. For example, if the parts 5 are IC chips, the chips fit within the tube 7 so that the pins of each chip face in the same direction within the tube 7. FIG. 8 shows the orientation of an IC chip in a tube 7. The parts 5 shown in FIG. 8 are of the small outline J-leaded package (SOJ) type. The pins 90 of the part 5 extend into the legs of the U-shaped tube 7 to keep the parts 5 aligned within the tubes 7. Similarly, pins 90 with the same pin numbers are aligned so that each chip is in the same orientation within the tube 7. The parts 5 normally fill the tubes 7 such that the parts are in contact with each other and snugly fit within the tubes 7.

Referring now to the embodiment of the invention shown in FIGS. 1–3, there is shown a tape and reel de-reeler, referred to in its entirety as 8, for removing parts 5 from tape 1 and placing the parts 5 in tubes 7. The tape and reel de-reeler 8 in general comprises a head plate assembly 10, a platform 40 for supporting the head plate assembly 10, and one or more rollers 45 connected to a handle 47.

As best shown in FIG. 5, the head plate assembly 10 may consist of an upper head plate 11 connected to a lower head plate 12. The upper head plate 11 and lower head plate 12 are made of a rigid material such as metal or hard plastic. The connection of the upper head plate 11 to the lower head plate 12 can be accomplished by a variety of conventional means, such as the hinges 9 shown in FIG. 2. Referring back to FIG. 5, a channel or groove 13 in the upper head plate 11 extends from the forward end 14 to the exit end 15 of the head plate assembly 10. The width of the groove 13 must be at least as large as the width of the socketed portion of the tape 1, and the depth of the groove 13 should be slightly larger than the depth of a socket 4 in the tape 1. In one embodiment, the lower head plate 12 has a notch 55, which is slightly larger in width than the groove 13 in the upper head plate 11, that extends from the forward end 14 to the exit end 15 of the lower head plate 12. This notch 55 is best seen in FIGS. 1–3 and 5.

The lower head plate 12 contains an orifice 16 extending through the lower head plate 12 to the lower surface 27 of the lower head plate 12. The orifice 16 shown is rectangular in shape, although this is not absolutely necessary. The orifice 16 need only be sufficient in size to allow the sealing tape 3 from the tape 1 to pass freely through the orifice 16. The orifice as shown in FIG. 5 is located approximately halfway between the forward end 14 and the exit end 15 of the head plate assembly 10. The location of the orifice 16 need not be precise; however, the orifice 16 must be located so that there is enough room between the orifice 16 and the forward end 14 of the lower head plate 12 to support the tape 1 and enough room between the orifice 16 and the exit end 15 of the lower head plate 12 to allow the parts 5 to fall freely from the socketed tape 2 and into the slot 20, as will be explained below.

A groove 19 in the lower head plate 12 extends from the orifice 16 toward the exit end 15 of the head plate assembly 10, as best shown in FIG. 5. The width of this groove 19 is approximately the same as the groove 13 in the upper head plate 11. It must be at least as large as the width of the socketed portion of the tape 1. The height of this groove 19 may be slightly less than the thickness of the parts 5 in the tape 1. This groove 19 in the lower head plate 12 intersects with a part receiving station 20 toward the exit end 15 of the lower head plate 12. This part receiving station 20, also called a slot 20, is formed generally perpendicular to the groove 19 in the lower head plate 12 and in the plane of the lower head plate 12. It is also generally perpendicular to the channel or groove 13 in the upper head plate 11. FIG. 5 shows an extension 21 of the lower head plate 12 in which the slot 20 extends outward from the main body of the lower head plate 12 to aid in supporting a tube 7.

One purpose of the slot 20 in the lower head plate 12 is for receiving the parts 5 as they fall from the socketed tape 2. A tube 7 fits within the slot 20, such that when parts 5 fall into the slot 20 they slide down the length of the slot 20 and into the tube 7, as best shown in FIG. 1. The length of the slot 20 need only be sufficient to allow transition of the parts 5 from the tape 1 into the slot 20 and to allow attachment of the tube 7 within the slot 20. This extension 21 of the lower head plate 12 in which the slot 20 extends is therefore not necessary. The slot 20 could extend only to the edge of the main body of the lower head plate 12.

A cross-sectional view of the head plate assembly 10 is shown in FIG. 6. The tape 1 is placed on the lower head plate 12. The upper head plate 11 is then closed upon the lower head plate 12 such that the area of the upper head plate 11 adjacent the groove 13 is in contact with the outer portions of the lower head plate 12. A latch or other conventional locking mechanism can be used to lock the upper head plate 11 to the lower head plate 12. FIG. 5 shows a latch 17 attached to the upper head plate 11 and a securing means 18 attached to the lower head plate 12. The closing of the upper head plate 11 upon the lower head plate 12 creates a closed channel 22 for placement of the tape 1, as shown in FIG. 6. The closed channel 22 extends from the forward end 14 of the head plate assembly 10 to an exit 26 at the exit end 15 of the head plate assembly 10. The groove 19 in the lower head plate 12 forms a recess or depression 23 in the closed channel 22 adjacent to and toward the exit end 15 of the lower head plate 12 from the orifice 16.

The operation of the tape and reel de-reeler 8 is best shown in FIG. 6. Prior to enclosing the starting end of the tape 1 between the upper 11 and lower head plates 12, the sealing tape 3 is stripped slightly from the tape 1 and inserted through the orifice 16 in the lower head plate 12.

The tape 1 then rests in the closed channel 22 on the upper surface of the lower head plate 12. As the sealing tape 3 is advanced in the direction of the arrow A shown in FIG. 6, it separates from the tape 1 and the tape 1 moves from the forward end 14 to the exit end 15 of the closed channel 22 within the head plate assembly 10 (in the direction of arrow B in FIG. 6). When the sealing tape 3 is removed from the tape 1 gravity acts upon the parts 5 within the sockets 4 of the tape 1 and causes the parts 5 to fall from the sockets 4 and come in contact with the upper surface of the lower head plate 12 forming the groove 19. The upper portion of the parts 5 remain in contact with the lower portions of the sockets 4 within the tape 1 and this contact forces the parts 5 in the direction of arrow B in FIG. 6.

When the parts 5 reach the slot 20 in the lower head plate 12 the parts 5 fall completely free from the sockets 4 and fall into the slot 20 in the lower head plate 12. The transitional slope 24 between the groove 19 in the lower head plate 12 and the slot 20 functions more smoothly when the transition area gradually slopes downward toward the bottom surface of the slot 20. This transitional slope 24 allows the parts 5 to slide down into the slot 20 without flipping over. A tube 7 is placed within the slot 20 in the lower head plate 12 for receiving the parts 5. Gravity acts upon the parts 5 to allow the parts 5 to slide down the slot 20 in the lower head plate 12 and into the open end of tube 7. FIGS. 1 and 7 best show the orientation of this tube 7 within the slot 20 in the lower head plate 12. To hold parts 5 in the tube 7, its lower end 30 is equipped with a plug 92.

The extension 21 may be formed as a part of the head plate assembly 10 or it may be a separate piece that attaches to the head plate assembly 10. One purpose of this extension 21 is to provide a length within the slot 20 for the parts 5 to gain speed before the parts 5 enter the tube 7. As FIG. 8 shows, the only way for the parts 5 to enter the tube 7 is through an end of the tube 7. The parts 5, therefore, must first fall from the socketed tape 2 and into contact with the slot 20 before entering the tube 7 from the upper end 31 of the tube 7, as shown in FIG. 1. One embodiment of the invention provides a dip in the slot 20 of the extension 21 or near the extension 21 in the head plate assembly 10. The depth of this dip is approximately equal to the thickness of the material used to form tube 7. As the parts 5 slide down the length of the slot 20, therefore, the parts 5 flow more smoothly into the tube 7 without being obstructed by the thickness of the walls of tube 7. The upper end 31 of the tube 7 (or regions very near to the upper end 31 of the tube 7) remains visible when the upper head plate 11 is closed upon the lower head plate 12, as best shown in FIG. 1. The user can therefore see when the tube 7 is full of parts 5, and can anticipate when to replace a full tube 7 with an empty tube 7. The tube 7 can be attached to the slot 20 by a variety of conventional means known in the art. One method is a compression fit of the tube 7 into the slot 20.

FIG. 6 shows an edge portion 28 of the lower head plate 12 that is adjacent slot 20 and at the same approximate height as the upper surface of notch 55 of the lower head plate 12. This edge portion 28 of the lower head plate 12, which forms the rear edge of the slot 20 in the lower head plate 12, helps to keep the socketed tape 2 elevated above the recess 23, slope 24, and slot 20 in the lower head plate 12. The support provided by the edge portion 28 allows each part 5 to fall from the socketed tape 2 as it passes through the closed channel 22.

FIGS. 5 and 6 show an embodiment of the tape and reel de-reeler 8 that contains a lip 25 extending from the edge portion 28 of the lower head plate 12 toward the forward end 14 of the lower head plate 12. This lip 25 serves a dual purpose. The lip 25 provides vertical support for the tape 1 as it moves through the channel 22 and it also deflects some parts 5 downward into the slot 20 as the parts 5 exit the sockets 4 of the socketed tape 2.

Gravity acts upon the parts 5 within the socketed tape 2 to cause the parts 5 to fall from the socketed tape 2 and into contact with the slot 20 within the lower head plate 12, as shown in FIG. 6. For this reason, during operation of the tape and reel de-reeler 8 the lower head plate 12 should be situated generally below the upper head plate 11. If the parts 5 are IC chips, the pins 90 of the parts 5 should face generally upward. As best shown in FIGS. 1 and 7, gravity also acts on the parts 5 to move the parts 5 downward within the slot 20 and into the tube 7 after the parts 5 are emptied from the tape 1. For this reason, the lower end 30 of the tube 7 should be situated below the upper end 31 of the tube 7 that is attached to the slot 20.

As best shown in FIG. 6, the operator can pull the sealing tape 3 downward through the orifice 16 in the lower head plate 12 in the direction of arrow A to advance the tape 1 in the direction of arrow B. When the tube 7 within the slot 20 becomes full of parts 5, the operator can stop pulling the sealing tape 3, remove the full tube 7 from the slot 20, and then place a fresh empty tube 7 within the slot 20. The operator can then resume pulling the sealing tape 3 to operate the tape and reel de-reeler 8. In this embodiment the upper 11 and lower head plates 12 need not be attached to a platform 40.

FIGS. 1–3 and 5 show an embodiment of the invention in which the head plate assembly 10 is connected to a platform, referred to in its entirety as 40. A platform 40 may be useful to stabilize the tape and reel de-reeler 8 for ease of use during operation, or for the attachment of further parts to the invention. The platform 40 of FIGS. 1–3 and 5 consists of a platform base 41 and two arms 42. FIGS. 1–3 and 5 show an embodiment of the tape and reel de-reeler 8 in which the lower head plate 12 is attached to a platform 40. This attachment can be in a fixed position, but it may also be movable. An adjustable connection could be accomplished by a variety of conventional means, such as hinges (not shown). As shown in FIG. 3, an angle $\Omega$ is formed between the head plate assembly 10 and a line perpendicular to and extending from the base 41. The adjustment of this angle $\Omega$ controls the flow of the parts 5 into the tubes 7, such that as the angle $\Omega$ decreases the parts 5 flow more freely down the length of the tube 7.

Another embodiment of the invention involves the use of a tape advancer, which may comprise one or more rollers 45 attached to the platform 40. As best shown in FIGS. 2 and 3, two rollers 45 for forming the tape advancer can be attached between arms 42 of the platform extending from the platform base 41. One of these rollers 45 should be mounted between the arms 42 of the platform 40 with each end of the roller axle 46 extending through one of the platform arms 42. To one protrusion of the roller axle 46 a handle 47 may be attached to provide a means to turn the rollers 45. The line of contact between the rollers 45 should be snug to allow gripping of the sealing tape 3. As FIG. 4 best shows, rotation of one of the rollers 45 rotates the other roller 45 in the opposite direction. The line of contact between the rollers 45 grips the sealing tape 3 and pulls the sealing tape 3 through the orifice 16. Another embodiment uses as the tape advancer only one roller 45, upon which the sealing tape 3 is wound to pull the sealing tape 3 through the orifice 16.

As FIG. 3 shows, an angle $\phi$ is formed between the sealing tape 3 as it leaves the orifice 16 and a line perpendicular to and extending from the base 41. An angle $\Omega$ of less than 90 degrees causes the sealing tape 3 to exit the orifice 16 at an angle $\phi$. In order to allow an embodiment of the tape and reel de-reeler 8 utilizing rollers 45 to function smoothly, a deflection bar 48 is needed to deflect the sealing tape 3 to the proper angle for approaching the rollers 45. An angle $\partial$ is formed between the sealing tape and the line of contact of the rollers 45. Angle $\partial$ should be substantially 90 degrees for the tape and reel de-reeler 8 to function smoothly. The deflection bar 48 can be mounted to the upper 11 or lower head plate 12, or to the platform 40. FIGS. 2 and 3 show a deflection bar 48 attached to an arm 42 of the platform 40. This deflection bar 48 can be adjustable to provide for the proper angle $\partial$ of approach of the sealing tape 3 to the rollers 45.

Another embodiment of the tape and reel de-reeler 8 involves the use of a vibrator 50 attached to the tape and reel de-reeler 8, as best shown in FIGS. 2 and 3. The vibrator 50 as shown is attached to the lower head plate 12, although it may also be attached to the platform 40 or to the upper head plate 11. The vibrator 50 eases the use of the tape and reel de-reeler 8 by vibrating the tape and reel de-reeler 8 (in particular those surfaces on which the parts 5 slide) to cause the parts 5 to fall more freely from the socketed tape 2 and to move freely in the tube 7 inserted in the slot 20.

The present invention provides a method for quickly removing parts 5 from tape 1 and placing the parts 5 in tubes 7. The tape and reel de-reeler 8 accomplishes this by removing the sealing tape 3 from the tape 1 while advancing the tape 1, allowing the parts 5 to fall from the socketed tape 2 into the part receiving station 20 in the head plate assembly 10, and then collecting the parts 5 in tubes 7 attached to the tape and reel de-reeler 8. This invention allows the user to remove parts 5 from tape 1 and place the parts 5 in tubes 7 more quickly and easily than manually removing the parts 5 and inserting the parts 5 into tubes 7.

While the present invention has been described with reference to several embodiments thereof, those skilled in the art will recognize various changes that may be made without departing from the spirit and scope of the claimed invention. Accordingly, this invention is not limited to what is shown in the drawings and described in the specification but only as indicated in the appended claims.

I claim:

1. A method for removing parts from socketed tape sealed with sealing tape comprising:
    (a) placing the socketed tape sealed with sealing tape in a channel with the socket openings facing the lower surface of the channel;
    (b) stripping the sealing tape from the socketed tape through an orifice in the lower surface of the channel;
    (c) vibrating the socketed tape to cause the parts to fall more freely from the socketed tape by applying vibration to a head assembly in which the channel is formed; and
    (d) collecting the parts as the parts fall free from the socketed tape.

2. The method of claim 1 further comprising:
    positioning a tube within a part receiving station communicating with the channel to collect the parts as the parts fall free from the socketed tape.

3. The method of claim 1 wherein the act of collecting the parts as the parts fall free from the socketed tape further comprises collecting the parts in a tube positioned in a part receiving station communicating with the channel.

4. The method of claim 1 wherein the act of stripping the sealing tape from the socketed tape comprises pulling the sealing tape with a tape advancer.

5. The method of claim 4 wherein the act of pulling comprises engaging the sealing tape with one or more rollers.

6. The method of claim 4 wherein the act of pulling comprises rotating a handle to drive the one or more rollers.

7. A method for removing parts from socketed tape sealed with sealing tape comprising:

(a) aligning the socketed tape on a head assembly;

(b) stripping the sealing tape from the socketed tape through an orifice in the lower side of the head assembly; the stripping causing the socketed tape to advance across the head assembly;

(c) applying vibration to the head assembly to cause the parts to fall freely from the socketed tape and progress in a slot in the head assembly; and (d) collecting the parts as the parts fall free from the socketed tape.

8. The method of claim 7 further comprising:

positioning a tube within a part receiving station in the head assembly to collect the parts as the parts fall free from the socketed tape.

9. The method of claim 7 wherein the act of collecting the parts as the parts fall free from the socketed tape further comprises collecting the parts in a tube positioned in a part receiving station in the head assembly.

10. The method of claim 7 wherein the act of stripping the sealing tape from the socketed tape comprises pulling the sealing tape with a tape advancer.

11. The method of claim 10 wherein the act of pulling comprises engaging the sealing tape with one or more rollers.

12. The method of claim 10 wherein the act of pulling comprises rotating a handle to drive the one or more rollers.

13. A method for removing parts from socketed tape sealed with sealing tape comprising:

(a) aligning the socketed tape in a channel on a head assembly;

(b) stripping the sealing tape from the socketed tape through an orifice in the lower side of the head assembly; the act of stripping causing the socketed tape to advance through the channel and across the head assembly; and (c) collecting the parts in a slot as the parts fall free from the socketed tape, wherein the slot is generally perpendicular to the channel and wherein a transitional slope smoothly descends from the channel to the slot.

14. The method of claim 13 wherein the head assembly is connected to a platform, and wherein an angle of the head assembly relative to the platform is adjustable.

15. The method of claim 13 wherein the act of stripping the sealing tape from the socketed tape comprises pulling the sealing tape with a tape advancer.

16. The method of claim 15 further comprising deflecting the sealing tape after the act of stripping so that the sealing tape approaches the tape advancer at a proper angle.

17. The method of claim 16 further comprising vibrating the head assembly and slot to cause the parts to fall freely from the socketed tape and to progress in the slot.

* * * * *